(12) United States Patent
Hietala

(10) Patent No.: US 8,489,042 B1
(45) Date of Patent: Jul. 16, 2013

(54) POLAR FEEDBACK LINEARIZATION

(75) Inventor: Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 377 days.

(21) Appl. No.: 12/900,880

(22) Filed: Oct. 8, 2010

Related U.S. Application Data

(60) Provisional application No. 61/249,775, filed on Oct. 8, 2009.

(51) Int. Cl.
*H04B 1/04* (2006.01)
*H01Q 11/12* (2006.01)

(52) U.S. Cl.
USPC ........................ 455/114.3; 455/126

(58) Field of Classification Search
USPC ............. 455/114.2, 114.3, 126, 127.2, 127.3; 375/296, 297; 330/149
See application file for complete search history.

(56) References Cited

U.S. PATENT DOCUMENTS

| | | | |
|---|---|---|---|
| 3,900,823 A | 8/1975 | Sokal et al. |
| 4,389,618 A | 6/1983 | Bauman |
| 4,609,881 A | 9/1986 | Wells |
| 4,837,786 A | 6/1989 | Gurantz et al. |
| 4,968,908 A | 11/1990 | Walls |
| 5,055,802 A | 10/1991 | Hietala |
| 5,079,522 A | 1/1992 | Owen |
| 5,313,411 A | 5/1994 | Tsujimoto |
| 5,430,416 A | 7/1995 | Black et al. |
| 5,444,415 A | 8/1995 | Dent |
| 5,524,286 A | 6/1996 | Chiesa et al. |
| 5,598,436 A | 1/1997 | Brajal |
| 5,608,353 A | 3/1997 | Pratt |
| 5,617,450 A | 4/1997 | Kakuishi et al. |
| 5,629,648 A | 5/1997 | Pratt |
| 5,822,011 A | 10/1998 | Rumreich |
| 5,900,778 A | 5/1999 | Stonick et al. |
| 5,952,895 A | 9/1999 | McCune et al. |
| 6,008,703 A | 12/1999 | Perrott et al. |
| 6,101,224 A | 8/2000 | Lindoff |
| 6,115,684 A | 9/2000 | Kawahara |
| 6,130,579 A | 10/2000 | Iyer et al. |

(Continued)

OTHER PUBLICATIONS

Andraka, Ray, "A Survey of CORDIC Algorithms for FPGA Based Computers," Association for Computing Machinery, 0-89791-978-5, 1998.

(Continued)

*Primary Examiner* — Nguyen Vo
(74) *Attorney, Agent, or Firm* — Withrow & Terranova, P.L.L.C.

(57) ABSTRACT

A system and method for providing a polarization feedback linearization to correct a non-linear amplitude error of an amplitude and phase detector or polar detector is disclosed. The method involves correcting a non-linear phase error of an amplitude detector via a look up table (LUT) that is driven by a radio frequency (RF) signal. The LUT provides values that are usable to correct an RF output that is a function of the RF output signal and is not a function of a device that incorporates the open loop modulation system of the present disclosure. Specifically, a detection of the corrected RF output amplitude is usable to drive a phase correction so that the RF output with corrected phase is a function of the RF output alone and not a function of a system or circuit that generates the RF output signal.

19 Claims, 4 Drawing Sheets

U.S. PATENT DOCUMENTS

| | | | |
|---|---|---|---|
| 6,141,390 A | 10/2000 | Cova | |
| 6,191,656 B1 | 2/2001 | Nadler | |
| 6,211,747 B1 | 4/2001 | Trichet | |
| 6,229,395 B1 | 5/2001 | Kay | |
| 6,236,687 B1 | 5/2001 | Caso et al. | |
| 6,236,703 B1 | 5/2001 | Riley | |
| 6,236,837 B1 | 5/2001 | Midya | |
| 6,240,278 B1 | 5/2001 | Midya | |
| 6,246,286 B1 | 6/2001 | Persson | |
| 6,271,727 B1 | 8/2001 | Schmukler | |
| 6,275,685 B1 * | 8/2001 | Wessel et al. | 455/126 |
| 6,285,239 B1 | 9/2001 | Iyer | |
| 6,288,610 B1 | 9/2001 | Miyashita | |
| 6,295,442 B1 | 9/2001 | Camp, Jr. et al. | |
| RE37,407 E | 10/2001 | Eisenberg et al. | |
| 6,307,364 B1 | 10/2001 | Augustine | |
| 6,329,809 B1 | 12/2001 | Dening | |
| 6,335,767 B1 | 1/2002 | Twitchell | |
| 6,356,150 B1 | 3/2002 | Spears et al. | |
| 6,359,950 B2 | 3/2002 | Gossmann et al. | |
| 6,366,177 B1 | 4/2002 | McCune | |
| 6,377,784 B2 | 4/2002 | McCune | |
| 6,392,487 B1 | 5/2002 | Alexanian | |
| 6,417,731 B1 | 7/2002 | Funada et al. | |
| 6,462,617 B1 | 10/2002 | Kim | |
| 6,489,846 B2 | 12/2002 | Hatsugai | |
| 6,504,885 B1 | 1/2003 | Chen | |
| 6,522,121 B2 | 2/2003 | Coumou | |
| 6,581,082 B1 | 6/2003 | Opsahl | |
| 6,587,514 B1 | 7/2003 | Wright et al. | |
| 6,642,786 B1 | 11/2003 | Jin et al. | |
| 6,693,468 B2 | 2/2004 | Humphreys | |
| 6,700,929 B1 | 3/2004 | Shan | |
| 6,701,134 B1 | 3/2004 | Epperson | |
| 6,701,138 B2 | 3/2004 | Epperson | |
| 6,720,831 B2 | 4/2004 | Dening | |
| 6,724,252 B2 | 4/2004 | Ngo et al. | |
| 6,724,265 B2 | 4/2004 | Humphreys | |
| 6,724,831 B1 | 4/2004 | Hasegawa | |
| 6,728,324 B1 | 4/2004 | Shan | |
| 6,731,145 B1 | 5/2004 | Humphreys | |
| 6,735,419 B2 | 5/2004 | Mitzlaff | |
| 6,748,204 B1 | 6/2004 | Razavi | |
| 6,782,244 B2 | 8/2004 | Steel et al. | |
| 6,798,843 B1 | 9/2004 | Wright et al. | |
| 6,801,086 B1 | 10/2004 | Chandrasekaran | |
| 6,807,406 B1 | 10/2004 | Razavi | |
| 6,816,718 B2 | 11/2004 | Yan | |
| 6,819,914 B2 | 11/2004 | Yan et al. | |
| 6,819,941 B2 | 11/2004 | Dening et al. | |
| 6,831,506 B1 | 12/2004 | Moffat | |
| 6,834,084 B2 | 12/2004 | Hietala | |
| 6,836,517 B2 | 12/2004 | Nagatani et al. | |
| 6,900,778 B1 | 5/2005 | Yamamoto | |
| 6,901,039 B1 | 5/2005 | Sugie | |
| 6,901,514 B1 | 5/2005 | Iu | |
| 6,903,604 B2 | 6/2005 | Kim | |
| 6,914,943 B2 | 7/2005 | Shimizu | |
| 6,975,688 B2 | 12/2005 | Rexberg | |
| H2143 H | 2/2006 | Prockup | |
| 7,010,276 B2 | 3/2006 | Sander et al. | |
| 7,010,280 B1 | 3/2006 | Wilson | |
| 7,012,969 B2 | 3/2006 | Ode et al. | |
| 7,054,385 B2 | 5/2006 | Booth et al. | |
| 7,109,791 B1 | 9/2006 | Epperson | |
| 7,113,036 B2 | 9/2006 | Moffatt | |
| 7,113,551 B2 | 9/2006 | Sills et al. | |
| 7,158,494 B2 | 1/2007 | Sander et al. | |
| 7,349,490 B2 | 3/2008 | Hunton | |
| 7,457,586 B1 | 11/2008 | Hietala et al. | |
| 7,529,523 B1 | 5/2009 | Young et al. | |
| 7,542,520 B1 | 6/2009 | Estrada | |
| 7,593,698 B1 | 9/2009 | Johnson et al. | |
| 2001/0022532 A1 | 9/2001 | Dolman | |
| 2001/0033238 A1 | 10/2001 | Velazquez | |
| 2002/0008578 A1 | 1/2002 | Wright et al. | |
| 2002/0021764 A1 | 2/2002 | Posti | |
| 2002/0041210 A1 | 4/2002 | Booth et al. | |
| 2002/0044014 A1 | 4/2002 | Wright et al. | |
| 2002/0060606 A1 | 5/2002 | Andre | |
| 2002/0093378 A1 | 7/2002 | Nielsen | |
| 2002/0113905 A1 | 8/2002 | Lee | |
| 2002/0160821 A1 | 10/2002 | Kaikati | |
| 2002/0167923 A1 | 11/2002 | Sendonaris | |
| 2003/0012289 A1 | 1/2003 | Lindoff | |
| 2003/0020538 A1 | 1/2003 | Kim | |
| 2003/0087617 A1 | 5/2003 | Shohara | |
| 2003/0133518 A1 | 7/2003 | Koomullil | |
| 2003/0161487 A1 | 8/2003 | Husted | |
| 2003/0179830 A1 | 9/2003 | Eidson et al. | |
| 2003/0197558 A1 | 10/2003 | Bauder et al. | |
| 2003/0197559 A1 | 10/2003 | Ghannouchi et al. | |
| 2003/0206056 A1 | 11/2003 | Hietala | |
| 2003/0215025 A1 | 11/2003 | Hietala | |
| 2003/0215026 A1 | 11/2003 | Hietala | |
| 2003/0227342 A1 | 12/2003 | Liu | |
| 2004/0072597 A1 | 4/2004 | Epperson | |
| 2004/0121741 A1 | 6/2004 | Rashev | |
| 2004/0131129 A1 | 7/2004 | Harron et al. | |
| 2004/0183511 A1 | 9/2004 | Dening | |
| 2004/0198414 A1 | 10/2004 | Hunton | |
| 2004/0208157 A1 | 10/2004 | Sander et al. | |
| 2005/0002470 A1 | 1/2005 | Saed et al. | |
| 2005/0018765 A1 | 1/2005 | Endres et al. | |
| 2005/0195919 A1 | 9/2005 | Cova | |
| 2006/0071711 A1 | 4/2006 | Persson | |
| 2006/0178120 A1 | 8/2006 | Puma | |
| 2006/0203899 A1 | 9/2006 | Gee | |
| 2006/0280502 A1 | 12/2006 | Sekine et al. | |
| 2007/0110199 A1 | 5/2007 | Momtaz et al. | |
| 2007/0190952 A1 | 8/2007 | Waheed et al. | |
| 2008/0219332 A1 | 9/2008 | Brehler | |
| 2008/0310617 A1 | 12/2008 | Daecke et al. | |
| 2009/0054018 A1 * | 2/2009 | Waheed et al. | 455/126 |
| 2009/0252255 A1 | 10/2009 | Lee et al. | |

OTHER PUBLICATIONS

Cusinato, Paolo, "Gain/Bandwidth Programmable PA Control Loop for GSM/GPRS Qud-Band Cellular Handsets," IEEE Journal of Solid-State Circuits, Jun. 2004, pp. 960-966, vol. 39, No. 6, IEEE.

Johnson, Jackie, "Power Amplifier Design for Open Loop EDGE Large Signal Polar Modulation Systems," RFDesign, Jun. 2006, pp. 42-50.

Pinto et al., "Phase Distortion and Error Vector Magnitude for 8-PSK Systems," London Communications Symposium, Sep. 14-15, 2000, University College London, London, England.

Volder, Jack E., "The CORDIC Trigonometric Computing Technique," IRE Trans. On Elect. Computers p. 330, Sep. 1959.

* cited by examiner

POLAR FEEDBACK LINEARIZATION

RELATED APPLICATIONS

This application claims the benefit of provisional patent application Ser. No. 61/249,775, filed Oct. 8, 2009, the disclosure of which is hereby incorporated herein by reference in its entirety.

FIELD OF THE DISCLOSURE

The present disclosure relates to a method for correcting non-linear phase error of an amplitude detector via a look-up table matched to an input signal.

BACKGROUND

An interfering signal at the antenna of a traditional closed loop polar modulation system having a frequency synthesizer can cause the frequency synthesizer to attempt to lock on to the interfering signal. A frequency synthesizer lock on to an interfering signal will usually result in a complete failure of the communication functions of a device incorporating the traditional closed loop polar modulation system. Open loop polar modulation systems have been developed to reduce the possibility of a frequency synthesizer locking on to interfering signals. At worst, these open loop polar modulation systems will, suffer an error for one timeslot before a correction is made.

In an open loop polar modulation system, correction tables for amplitude modulation to amplitude modulation (AMAM) distortion and amplitude modulation to phase modulation (AMPM) distortion are developed during a one-time factory calibration of the open loop polar modulation system. As a result of the one-time factory calibration, the correction tables are permanently fixed for the life of a device such as a mobile terminal that incorporates the open loop polar modulation system. A weakness of such traditionally factory calibrated open loop polar modulation systems is that the correction tables for the AMAM distortion or the AMPM distortion will not be accurate under changing conditions like temperature and voltage standing wave ratio (VSWR). Consequently, there will be degradation of performance for error vector magnitude (EVM) and spectral purity.

Open loop polar modulation systems may overcome this weakness through the use of an adaptive feedback system in which the correction tables for the AMAM distortion and the AMPM distortion are updated during a ramp up of each transmission burst. Thus, changes in phase and amplitude of radio frequency (RF) output from a power amplifier (PA) in communication with the adaptive feedback system are corrected in a dynamic fashion. However, a new problem is introduced due to the adaptive nature of traditional open loop polar modulation systems. Specifically, an amplitude and phase feedback for driving open loop polar modulation systems must be largely linear with little AMPM distortion, otherwise the correction tables for AMAM distortion and AMPM distortion will become corrupted. The corruption of the correction tables will result in miscorrection of the AMAM distortion and the AMPM distortion, which in turn will result in erroneous feedback being passed on to the PA through PA feedback networks. What is needed is polar feedback linearization that provides amplitude and phase feedback that is largely linear, with little AMPM distortion, for driving open loop polar modulation systems.

SUMMARY

A system and method of the present disclosure produces polar feedback linearization that provides amplitude and phase feedback that is largely linear, with little amplitude modulation to phase modulation (AMPM) distortion, for driving open loop polar modulation systems. In particular, the system and method of the present disclosure provide a solution to the weakness of traditional open loop polar modulation systems by correcting a non-linear phase error of an amplitude detector via a look up table (LUT) that is driven by a radio frequency (RF) signal. The LUT provides values that are usable to correct an RF output that is a function of the RF output signal and is not a function of a device that incorporates the open loop modulation system of the present disclosure. Specifically, a detection of the corrected RF output amplitude is usable to drive a phase correction so that the RF output with corrected phase is a function of the RF output alone, and not a function of a system or circuit that generates the RF output signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
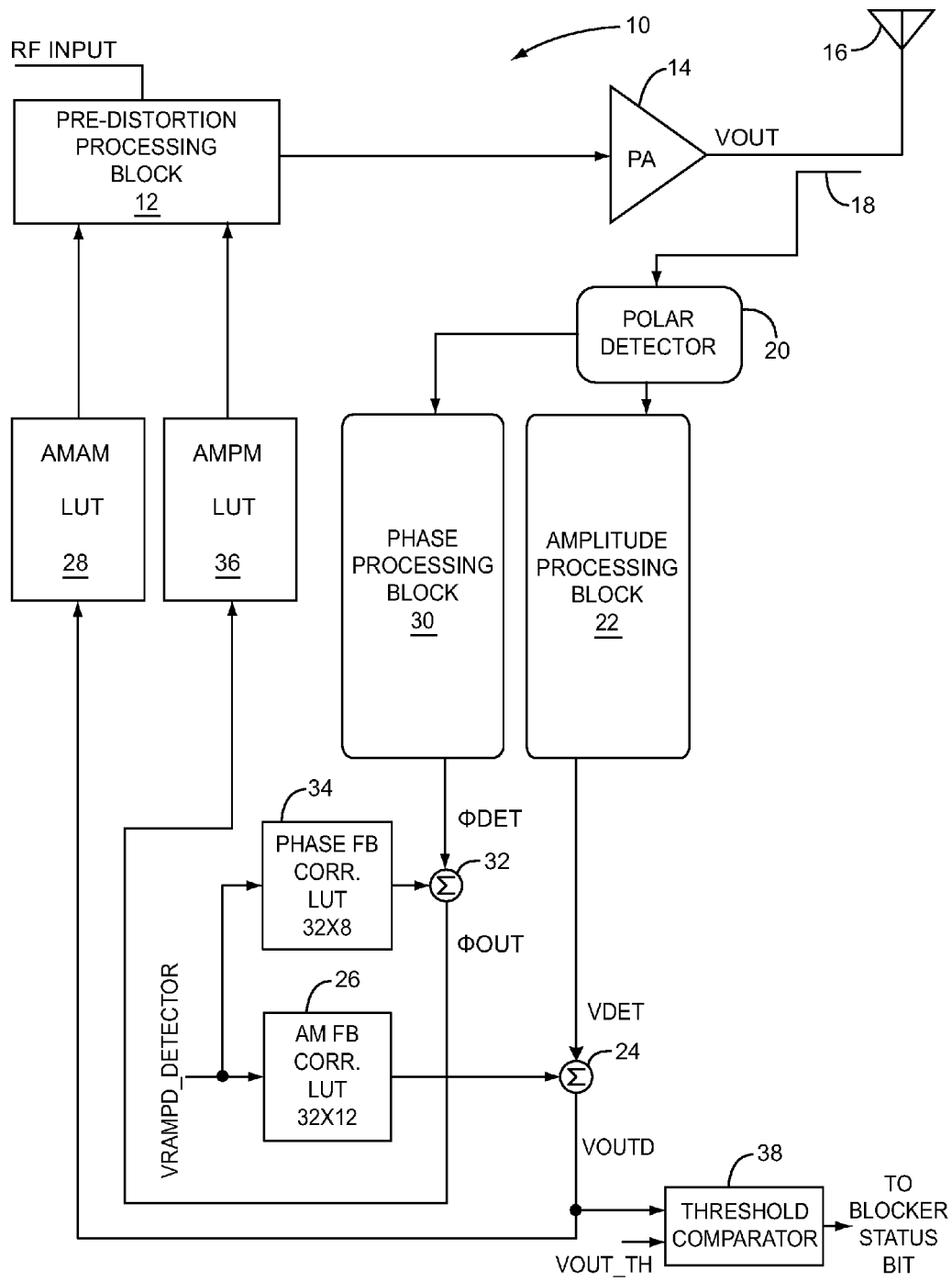
FIG. 1 is a block diagram of an initial embodiment of a polar feedback linearization system according to the present disclosure.

FIG. 1 is a block diagram of an initial embodiment of a polar feedback linearization system 10 according to the present disclosure. The polar feedback linearization system 10 includes a pre-distortion processing block 12 that receives a radio frequency (RF) signal from an RF signal generator (not shown). An output of the pre-distortion processing block 12 is fed into a power amplifier (PA) 14. An antenna 16 is communicatively coupled to an output of the PA 14. A directional coupler 18 directs a relatively small sample of a PA output signal (VOUT) into a polar detector 20. An amplitude and phase for the sample of VOUT is detected by the polar detector 20. An amplitude processing block 22 receives a detected amplitude from the polar detector 20 that corresponds to the amplitude of VOUT. The amplitude processing block 22 filters and then converts the detected amplitude into a digital signal (VDET). A first summation node 24 sums VDET with an AM feedback correction value provided from an amplitude modulation (AM) feedback correction look up table (LUT) 26 that is driven by a voltage ramp detector signal (VRAMPD_DETECTOR). A control system of a device such as a mobile terminal generates VRAMPD_DETECTOR, which corresponds with a plurality of PA control voltage levels. A summation of VDET with the AM feedback correction value produces a detected output signal (VOUTD) that updates an amplitude modulation to amplitude modulation (AMAM) LUT 28 that in turn outputs an AMAM signal that is usable by the pre-distortion processing block 12 to shape the amplitude of an RF signal at RF INPUT before the RF signal is amplified by the PA 14. FIG. 1 depicts the AM feedback correction LUT 26 as having thirty-two entries that are each twelve bits wide, but other numbers of entries and widths are usable.

A phase processing block 30 receives from the polar detector 20 an uncorrected detected phase that corresponds to VOUT. The phase processing block 30 converts the detected phase to an intermediate frequency (IF) before applying digital filtering and digital scaling. A resultant digital detected phase signal (φDET) is then output to a second summation node 32. A phase feedback correction LUT 34 that is driven by VRAMPD_DETECTOR provides a phase feedback correction value that is summed with φDET. The result is a phase signal output (φOUT) that updates an amplitude modulation to phase modulation (AMPM) LUT 36 that in turn outputs an AMPM signal that is usable by the pre-distortion processing block 12 to modify the phase of the RF signal at RF INPUT before the RF signal amplified by the PA 14. FIG. 1 depicts the phase feedback correction LUT 34 as having thirty-two entries that are each eight bits wide, but other numbers of entries and widths are usable.

The polar feedback linearization system 10 further includes a threshold comparator 38 that compares VOUTD with a threshold voltage VOUT_TH when the PA 14 is not transmitting to determine if an interference signal is coupled to the polar detector 20 from the antenna 16. The interference signal may come from a variety of sources, such as a television transmitter. When the amplitude of an interference signal exceeds VOUT_TH, the AM feedback correction and the PM feedback correction should be skipped or blocked until the amplitude of the interference signal falls below VOUT_TH. As long as the interference signal is present, the threshold comparator 38 will output a logic signal that will set a blocker status bit to a value that halts the AM feedback correction and the PM feedback correction. The output logic signal also halts the updating of the AMAM LUT with the corrected detector amplitude value and halts the updating of the AMPM LUT with the corrected detector phase value.

In operation, the polar feedback linearization system 10 provides a phase correction to the detected phase at each of the plurality of PA control voltage levels, and adds an amplitude correction to the detected amplitude at each of the plurality of PA control voltage levels. In particular, the AM feedback correction LUT 26 and the phase feedback correction LUT 34 are both driven by VRAMPD_DETECTOR that corresponds with the plurality of PA control voltage levels. The polar feedback linearization system 10 provides constant phase versus control voltage as well as a linear amplitude versus PA control voltage for each of the plurality of PA control voltage levels.

The polar detector 20 is assumed to be temperature and voltage standing wave ratio (VSWR) invariant. Based on this assumption, the detected amplitude and phase should always have the same characteristic relative to the PA output power, but not relative to the PA control voltage. However, the polar feedback linearization system 10 will exhibit errors versus temperature and VSWR because the relationship between PA output power or output voltage and the PA control voltage is a strong function of temperature and VSWR. Thus, errors resulting from temperature and VSWR effects are not correctable using the AM feedback correction LUT 26 and/or the phase feedback correction LUT 34.

Figure 2:
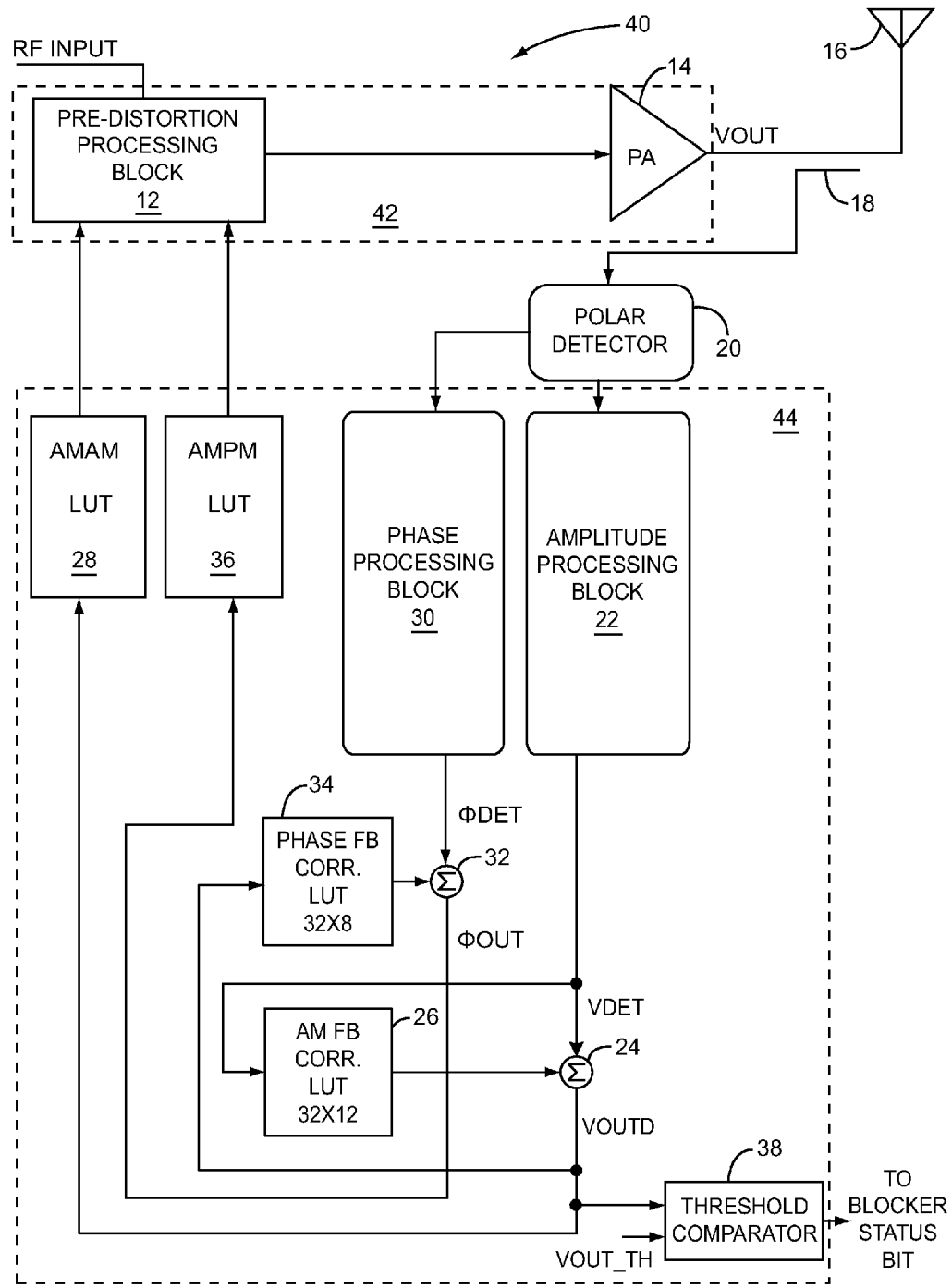
FIG. 2 is a block diagram of a preferred embodiment of a polar feedback linearization system according to the present disclosure.

FIG. 2 is a block diagram of a preferred polar feedback linearization system 40 that is in accordance with the present disclosure. The preferred polar feedback linearization system 40 is a modified version of the polar feedback linearization system 10 (FIG. 1). The pre-distortion processing block 12 along with the PA 14 make up a first sub-block 42 that may be incorporated into the PA circuitry of a device such as a mobile terminal. A second sub-block 44 for correcting a non-linear amplitude error of an amplitude detector such as the polar detector 20 may be incorporated into the power control circuitry of a device such as a mobile terminal.

The preferred polar feedback linearization system 40 eliminates using VRAMPD_DETECTOR (FIG. 1) to drive the AM feedback correction LUT 26 and the phase feedback correction LUT 34. Instead, the AM feedback correction LUT 26 is driven by VDET and the phase feedback correction LUT 34 is driven by VOUTD. In particular, the AM feedback correction LUT 26 receives VDET from the amplitude processing block 22 and uses VDET to output an appropriate amplitude correction value to sum with VDET via the first summation node 24 to produce VOUTD. In this way, the corrected amplitude output, VOUTD, is a function of VOUT of the PA 14, and not a function of the circuit used to create VOUT. The phase feedback correction LUT 34 receives VOUTD from the first summation node 24 and uses VOUTD to output an appropriate phase correction value that is summed with φDET to produce φOUT. In this way, the corrected amplitude detection having the value of VOUTD is used to drive a phase correction so that the corrected phase signal having the value φOUT is only a function of VOUT from the PA 14, and not a function of the circuit used to create VOUT. It is to be understood that the phase feedback correction LUT 26 and the amplitude feedback correction LUT 34 are driven (i.e., indexed) electronically and automatically by VDET and VOUTD using digital logic circuitry or digital processors as known in the art.

The detected amplitude VDET is a function of the RF input VOUT as given by the following relationship.

$$V_{det} = f(V_{out})$$

Ideally this is a linear function, but in reality it will depart from linearity and thus needs a correction.

The corrected output VOUTD shown in FIG. 2 is given as follows:

$$V_{outd} = V_{det} + \text{LUT}(V_{det})$$

Thus, the detected output VOUTD is a function of the output voltage, VOUT from the PA 14, only and thus does not depend on a PA control voltage such as VRAMPD_DETECTOR or the characteristics of the PA 14.

For the phase correction the phase feedback correction LUT 34 is driven from the corrected amplitude, VOUTD, which is an accurate representation of the actual output voltage, VOUT, from the PA 14. Thus, the phase correction value provided by the phase feedback correction LUT 34 is a function of the output voltage, VOUT, and not a function of a PA control signal such as VRAMPD_DETECTOR or the characteristics of the PA 14. The corrected phase signal having the value φPOUT is given by the following relationships.

$$\phi_{out} = \phi_{det} + LUT(V_{outd}) \text{ and } \phi_{det} = f(V_{out})$$

Figure 3:
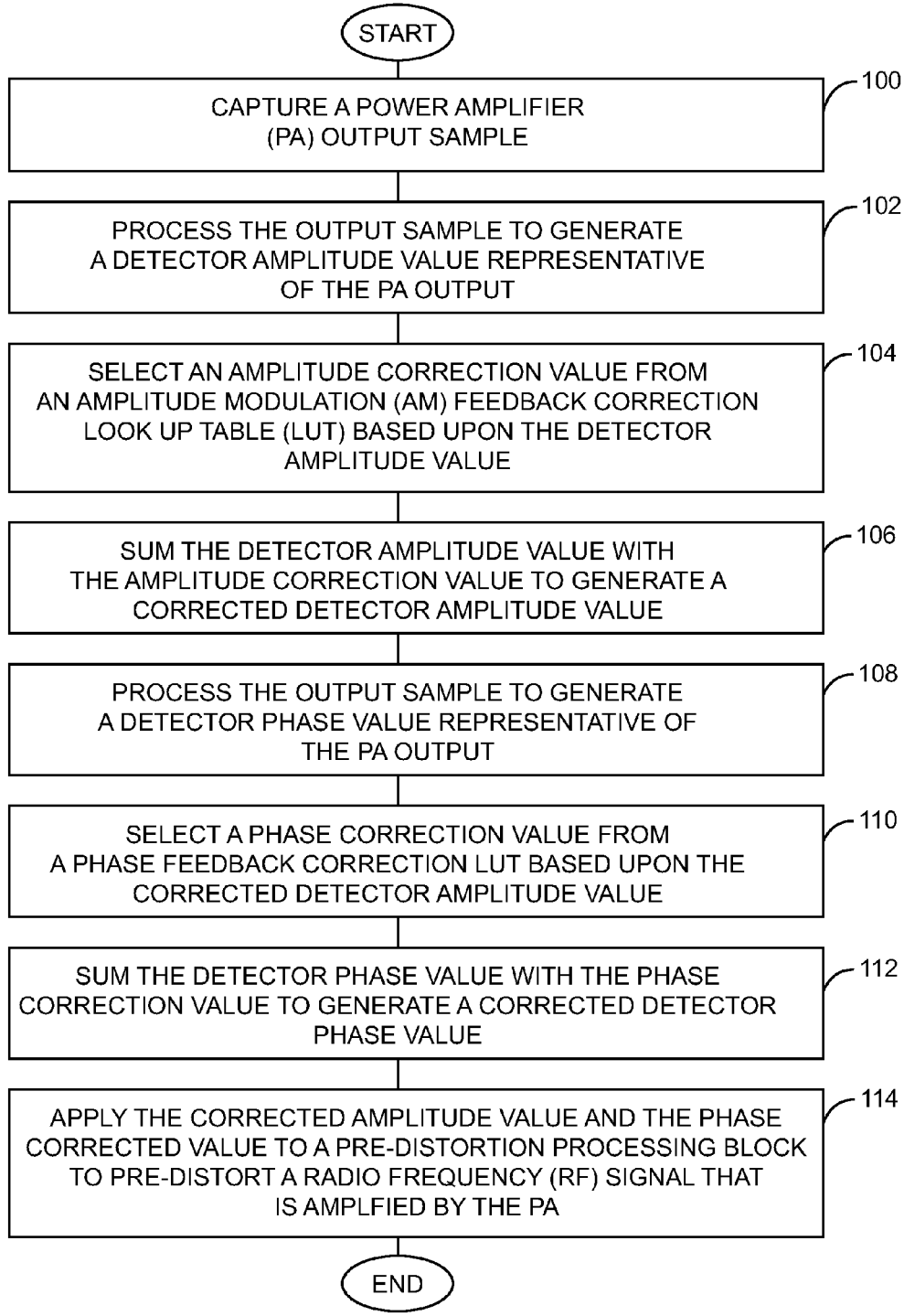
FIG. 3 depicts a flow for a method for correcting a non-linear amplitude error of an amplitude detector according to the present disclosure.

FIG. 3 depicts a flow for a method for correcting a non-linear amplitude error of an amplitude detector such as the polar detector 20 (FIG. 2). A sample of the output voltage of the PA 14 (FIG. 2) is captured by the directional coupler 18 (FIG. 2) (step 100). The sample of output voltage is processed by the amplitude processing block 22 to generate a detector amplitude value that is representative of the output of the PA 14 (step 102). The detector amplitude value drives the AM feedback correction LUT to select and output an amplitude correction value that corresponds to the detector amplitude value (step 104). The detector amplitude value and the amplitude correction value are summed together at the first summation node 24 to generate a corrected detector amplitude value (step 106). The sample of output voltage is also processed by the phase processing block 30 to generate a detector phase value that is representative of the output of the PA 14 (step 108). The detector phase value drives the phase feedback correction LUT to select and output a phase correction value that corresponds to the corrected detector amplitude value (step 110). The detector phase value and the phase correction value are summed together at the second summation node 32 to generate a corrected detector phase value (step 112). The corrected detector amplitude value and the corrected detector phase value are applied to the pre-distortion processing block 12 to pre-distort a radio frequency signal that is amplified by the PA 14 (step 114).

Figure 4:
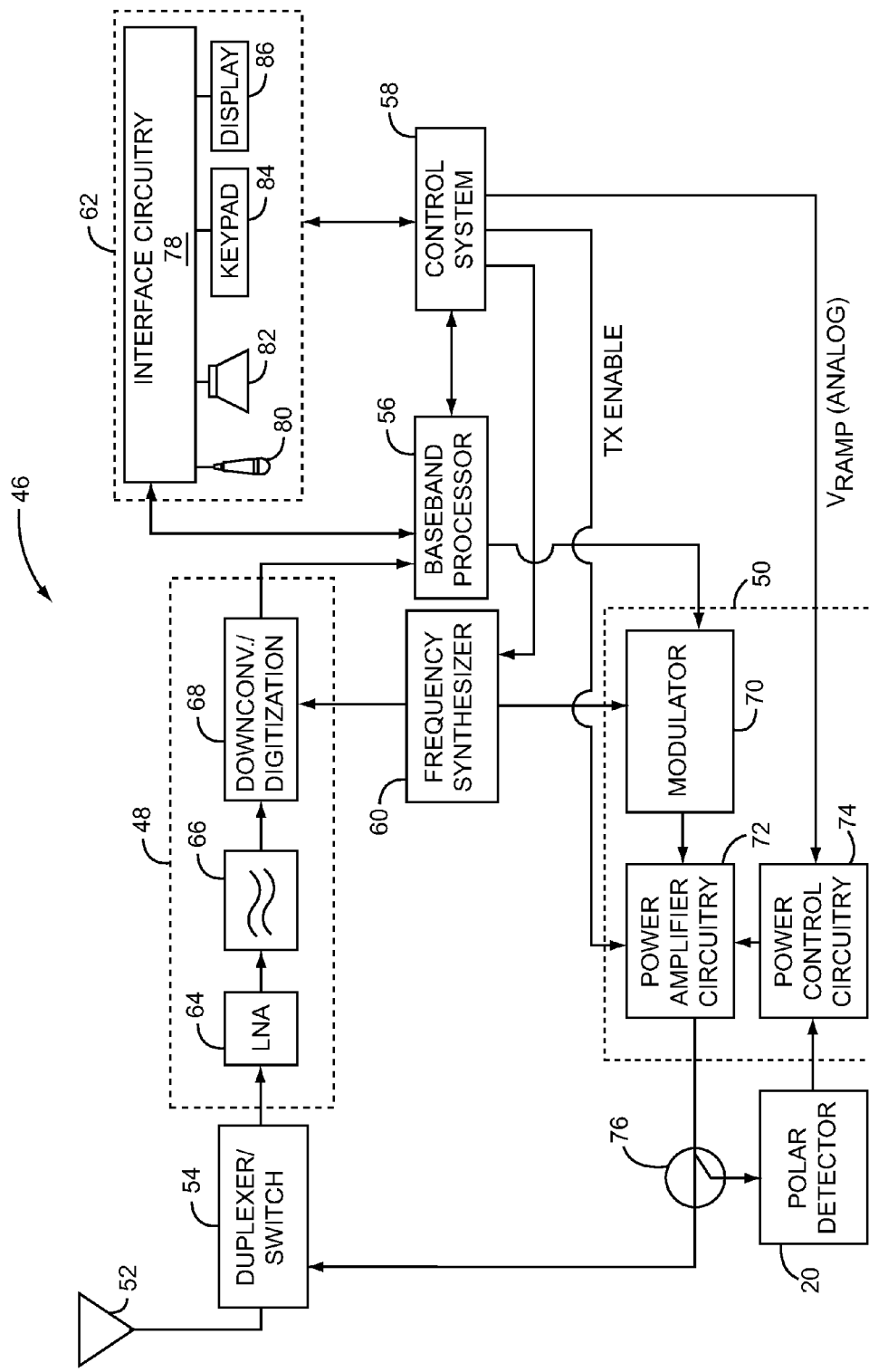
FIG. 4 is a block diagram of a mobile terminal that incorporates polar feedback linearization according to the present disclosure.

The preferred polar feedback linearization system 40 (FIG. 2) of the present disclosure is preferably incorporated in a mobile terminal 46, such as a mobile telephone, personal digital assistant (PDA), personal computer, or the like. The basic architecture of a mobile terminal 46 is represented in FIG. 4, and may include a receiver front end 48, an RF transmitter section 50, an antenna 52, a duplexer or switch 54, a baseband processor 56, a control system 58, a frequency synthesizer 60, and an interface 62.

The receiver front end 48 receives information bearing RF signals from one or more remote transmitters provided by a base station. A low noise amplifier (LNA) 64 amplifies an RF signal captured by the antenna 52. A filter circuit 66 minimizes broadband interference in the received RF signal, while a downconverter 68 downconverts the filtered, received RF signal to an intermediate or baseband frequency signal, which is then digitized into one or more digital streams. The receiver front end 48 typically uses one or more mixing frequencies generated by the frequency synthesizer 60.

The baseband processor 56 processes the digitized received signal to extract the information or data bits conveyed in the received signal. This processing typically comprises demodulation, decoding, and error correction operations. As such, the baseband processor 56 is generally implemented in one or more digital signal processors (DSPs).

On the transmit side, the baseband processor 56 receives digitized data from the control system 58, which it encodes for transmission. The encoded data is output to the radio frequency transmitter section 50, where it is used by a modulator 70 to modulate a carrier signal that is at a desired transmit frequency. PA circuitry 72 amplifies the modulated carrier signal to a level appropriate for transmission from the antenna 52. The PA circuitry 72 provides gain for the signal to be transmitted under control of power control circuitry 74, which is preferably controlled by the control system 58 using an adjustable power control signal (VRAMP). The first sub-block 42 (FIG. 2) is incorporated into the PA circuitry 72 to shape the amplitude of an RF signal before the RF signal is amplified. This pre-distortion of the RF signal cancels with distortion that is due to the PA circuitry 72.

Further still, a directional coupler 76 samples output power from the PA circuitry 72 and provides a small sample of the output power to the polar detector 20. In turn, the polar detector 20 provides an amplitude signal and a phase signal to the second sub-block 44 (FIG. 2) of the polar feedback linearization system 40 that in this case is incorporated into the power control circuitry 74. The directional coupler 76 provides around 15 dB of coupling for transmitter high band (HB) frequencies and around 17 dB of coupling for transmitter low band (LB) frequencies.

As a result of providing the amplitude signal and a phase signal from the polar detector 20 to the power control circuitry 74, the bias for the PA circuitry 72 is adjusted to maintain a desired output power under varying conditions, such as decreasing battery voltage and/or fluctuating VSWR, etc. The control system 58 may also provide a transmit enable signal (TX ENABLE) to effectively enable the PA circuitry 72 during periods of transmission.

A user may interact with the mobile terminal 46 via the interface 62, which may include interface circuitry 78 associated with a microphone 80, a speaker 82, a keypad 84, and a display 86. The interface circuitry 78 typically includes analog-to-digital converters, digital-to-analog converters, amplifiers, and the like. Additionally, the interface circuitry 78 may include a voice encoder/decoder, in which case it may communicate directly with the baseband processor 56.

The microphone 80 will typically convert audio input, such as the user's voice, into an electrical signal, which is then digitized and passed directly or indirectly to the baseband processor 56. Audio information encoded in the received signal is recovered by the baseband processor 56 and converted into an analog signal suitable for driving the speaker 82 and the interface circuitry 78. The keypad 84 and the display 86 enable the user to interact with the mobile terminal 46, inputting numbers to be dialed, address book information, or the like, as well as monitoring call progress information.

Those skilled in the art will recognize improvements and modifications to the preferred embodiments of the present disclosure. All such improvements and modifications are considered within the scope of the concepts disclosed herein and the claims that follow.

What is claimed is:

1. A method for correcting a non-linear amplitude error of an amplitude detector via an amplitude modulation (AM) feedback correction look up table (LUT) that is driven by an uncorrected output of the amplitude detector, the method comprising:

capturing an output signal sample from a power amplifier (PA);

processing the output signal sample to generate a detector amplitude value representative of an amplitude of an output signal of the PA;

selecting an amplitude correction value from the AM feedback correction LUT that corresponds to the detector amplitude value representative of the amplitude of the output signal of the PA;

generating a corrected detector amplitude value based upon the amplitude correction value; and comparing the corrected detector amplitude value with a predetermined threshold voltage when the PA is not transmitting to determine if an interference signal is coupled to the detector.

2. The method of claim 1 wherein generating the corrected detector amplitude value is accomplished by summing the detector amplitude value with the amplitude correction value.

3. The method of claim 1 further including:
processing the output signal sample to generate a detector phase value representative of a phase of the output signal of the PA;
selecting a phase correction value from a phase feedback correction LUT that corresponds to the corrected detector amplitude value for the output signal of the PA; and
generating a corrected detector phase value based upon the phase correction value.

4. The method of claim 3 wherein generating the corrected detector phase value is accomplished by summing the detector phase value with the phase correction value.

5. The method of claim 1 further including halting the correction of the non-linear amplitude error of the amplitude detector if the corrected detector amplitude value exceeds the predetermined threshold voltage.

6. A mobile terminal comprising:
a PA having an output;
a detector adapted to provide a detected amplitude signal that is representative of the amplitude of a signal output from the PA;
an amplitude processing block adapted to generate a detector amplitude value from the detected amplitude signal;
an AM feedback correction LUT adapted to be driven by the detector amplitude value to output an amplitude correction value; and
a first summation node adapted to generate a corrected detector amplitude value by summing the detector amplitude value with the amplitude correction value; and
a threshold comparator adapted to compare the corrected detector amplitude value with a predetermined threshold voltage when the PA is not transmitting to determine if an interference signal is coupled to the detector.

7. The mobile terminal of claim 6 wherein the detector is further adapted to provide a detected phase signal that is representative of the phase of the signal output from the PA.

8. The mobile terminal of claim 7 further including:
a phase processing block adapted to generate a phase detector value from the detected phase signal;
a phase modulation (PM) feedback correction LUT adapted to be driven by the corrected detector amplitude value to output a phase correction value; and
a second summation node adapted to generate a corrected detector phase value by summing the phase detector value with the phase correction value.

9. The mobile terminal of claim 6 wherein the threshold comparator is further adapted to output a logic signal to halt correction of the detector amplitude value if the corrected detector amplitude value exceeds the predetermined threshold voltage.

10. A method for correcting a non-linear amplitude error of an amplitude detector via an AM feedback correction LUT that is driven by an uncorrected output of the amplitude detector, the method comprising:
capturing an output signal sample from a PA;
processing the output signal sample to generate a detector amplitude value representative of an amplitude of an output signal of the PA;
selecting an amplitude correction value from the AM feedback correction LUT that corresponds to the detector amplitude value representative of the amplitude of the output signal of the PA;
generating a corrected detector amplitude value based upon the amplitude correction value;
processing the output signal sample to generate a detector phase value representative of a phase of the output signal of the PA;
selecting a phase correction value from a phase feedback correction LUT that corresponds to the corrected detector amplitude value for the output signal of the PA; and
generating a corrected detector phase value based upon the phase correction value.

11. The method of claim 10 wherein generating the corrected detector amplitude value is accomplished by summing the detector amplitude value with the amplitude correction value.

12. The method of claim 10 wherein generating the corrected detector phase value is accomplished by summing the detector phase value with the phase correction value.

13. The method of claim 10 further including comparing the corrected detector amplitude value with a predetermined threshold voltage when the PA is not transmitting to determine if an interference signal is coupled to the detector.

14. The method of claim 13 further including halting the correction of the non-linear amplitude error of the amplitude detector if the corrected detector amplitude value exceeds the predetermined threshold voltage.

15. A mobile terminal comprising:
a PA having an output;
a detector adapted to provide a detected amplitude signal and a detected phase signal that are representative of the amplitude and phase of a signal output from the PA;
an amplitude processing block adapted to generate a detector amplitude value from the detected amplitude signal;
an AM feedback correction LUT adapted to be driven by the detector amplitude value to output an amplitude correction value;
a first summation node adapted to generate a corrected detector amplitude value by summing the detector amplitude value with the amplitude correction value;
a phase processing block adapted to generate a phase amplitude value from the detected phase signal;
a PM feedback correction LUT adapted to be driven by the corrected detector amplitude value to output a phase correction value; and
a second summation node adapted to generate a corrected detector phase value by summing the phase value with the phase correction value.

16. The mobile terminal of claim 15 further comprising:
an amplitude modulation to amplitude modulation (AMAM) LUT adapted to be updated with the corrected detector amplitude value and in response output an AMAM signal;
an amplitude modulation to phase modulation (AMPM) LUT adapted to be updated with the corrected detector phase value and in response to output an AMPM signal; and
a pre-distortion processing block adapted to shape the amplitude of an radio frequency (RF) signal in response to the AMAM signal before the RF signal is amplified by the PA, and wherein the pre-distortion processing block is further adapted to modify the phase of the RF signal in response to the AMPM signal before the RF signal is amplified by the PA.

17. The mobile terminal of claim 15 further including a threshold comparator adapted to compare the corrected detector amplitude value with a predetermined threshold voltage when the PA is not transmitting to determine if an interference signal is coupled to the detector.

18. The mobile terminal of claim 17 wherein the threshold comparator is further adapted to output a logic signal to halt correction of the detector amplitude value and halt correction of the detector phase value if the corrected detector amplitude value exceeds the predetermined threshold voltage.

19. The mobile terminal of claim 18 wherein the output logic signal halts the updating of the AMAM LUT with the corrected detector amplitude value and halts the updating of the AMPM LUT with the corrected detector phase value.

* * * * *